(12) United States Patent
Ono (10) Patent No.: US 7,227,194 B2
(45) Date of Patent: Jun. 5, 2007

(54) SEMICONDUCTOR LIGHT EMITTING DEVICE

(75) Inventor: Reiji Ono, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/360,521

(22) Filed: Feb. 24, 2006

(65) Prior Publication Data

US 2006/0192224 A1 Aug. 31, 2006

(30) Foreign Application Priority Data

Feb. 24, 2005 (JP) .............................. 2005-048312

(51) Int. Cl.
*H01L 29/22* (2006.01)
*H01L 29/24* (2006.01)

(52) U.S. Cl. .......................... 257/99; 257/98; 257/100; 257/81; 257/95; 257/E33.056; 257/E33.057; 257/E33.058; 438/22

(58) Field of Classification Search .......... 257/98–100, 257/81, 95, E33.056, E33.057, E33.058, 257/E33.059; 438/22
See application file for complete search history.

(56) References Cited

U.S. PATENT DOCUMENTS

2003/0189830 A1* 10/2003 Sugimoto et al. ........... 362/294

2005/0280014 A1* 12/2005 Park et al. ..................... 257/98

FOREIGN PATENT DOCUMENTS

JP 198570 7/2002

OTHER PUBLICATIONS

U.S. Appl. No. 10/648,620, filed Aug. 25, 2003, Okazaki, Jun.
U.S. Appl. No. 10/025,013, filed Dec. 18, 2001, Okazaki, Jun.

* cited by examiner

*Primary Examiner*—Kenneth Parker
*Assistant Examiner*—Joseph Nguyen
(74) *Attorney, Agent, or Firm*—Oblon, Spivak, McClelland, Maier & Neustadt, P.C.

(57) ABSTRACT

A semiconductor light emitting device includes a mold resin having a cup shape portion on an upper surface of the mold resin. One or more holes penetrate through the cup shape portion to outside of the mold resin and/or one or more trenches extend from the cup-shaped portion to outside the mold resin. A first lead is provided in the mold resin and extending from the cup shape portion to outside of the mold resin in a first direction, and a second lead provided in the mold resin and extending from the cup shape portion to outside of the mold resin in a second direction which is opposite to the first direction. A light emitting element is mounted on the first lead in the cup shape portion, and a wire electrically connects the light emitting element and the second lead. A sealing resin is embedded in the one or more holes and the one or more trenches and is configured to seal the light emitting element and the wire.

7 Claims, 7 Drawing Sheets

SEMICONDUCTOR LIGHT EMITTING DEVICE

CROSS REFERENCE TO RELATED APPLICATION

This application is based upon and claims the benefit of priority from Japanese Patent Application No. 2005-48312, filed on Feb. 24, 2005, the entire contents of which are incorporated herein by reference.

BACKGROUND OF THE INVENTION

SMD (Surface Mounting Device) type semiconductor light emitting devices have a wide field of applications since such devices can be surface mounted to a printed circuit board.

With the application field being broadened, the semiconductor light emitting device may be used in a wide range ambient temperature. For example, in the automotive use, the semiconductor light emitting device may be required to be operable in a range of −40−+80 degree Centigrade.

On the other hand, a LED chip, a mold resin, a sealing resin and a metal lead frame have a different heat expansion coefficient and a different Young's modulus. In case an ambient temperature of the semiconductor light emitting device is raised and lowered, the sealing resin is expanded and compressed. So the optical characteristic of the semiconductor light emitting device may be worsened, or damage, such as peeling of the sealing resin from another constituent element and/or cracks in the LED chip, may occur in the semiconductor light emitting device.

SUMMARY

According to one aspect of the present invention, there is provided a semiconductor light emitting device including a mold resin having a cup shape portion on an upper surface of the mold resin and a hole extending from the cup shape portion to outside of the mold resin; a first lead provided in the mold resin and extending from the cup shape portion to outside of the mold resin in a first direction; a second lead provided in the mold resin and extending from the cup shape portion to outside of the mold resin in a second direction which is opposite to the first direction; a light emitting element mounted on the first lead in the cup shape portion; a wire electrically connecting the light emitting element and the second lead; and a sealing resin configured to seal the light emitting element and the wire, embedding the hole.

According to another aspect of the present invention, there is provided a semiconductor light emitting device including a mold resin having a cup shape portion on an upper surface of the mold resin; a first lead provided in the mold resin and extending from the cup shape portion to outside of the mold resin in a first direction; a second lead provided in the mold resin and extending from the cup shape portion to outside of the mold resin in a second direction which is opposite to the first direction; and the mold resin having a first trench extending from the cup shape portion to outside of the mold resin in a third direction and a second trench extending from the cup shape portion to outside of the mold resin in a fourth direction which is opposite to the third direction; a light emitting element mounted on the first lead in the cup shape portion; a wire electrically connecting the light emitting element and the second lead; and a sealing resin configured to seal the light emitting element and the wire, embedding the first trench and the second trench.

According to a further aspect of the present invention, there is provided a semiconductor light emitting device may include a mold resin having a cup shape portion on an upper surface of the mold resin and a hole penetrating from the cup shape portion to a bottom surface of the mold resin; a first lead having a first inner lead portion and a first outer lead portion, the first outer lead portion extending from the cup shape portion to outside of the mold resin in a first direction, the first inner lead portion provided in the cup shape portion and being thicker than the first outer lead portion; a second lead having a second inner lead portion and a second outer lead portion, the second outer lead portion extending from the cup shape portion to outside of the mold resin in a second direction which is opposite to the first direction, the second inner lead portion provided in the cup shape portion; a semiconductor light emitting element mounted on the first inner lead portion of the first lead; a wire connecting the semiconductor light emitting element and the second inner lead portion of the second lead; a sealing resin configured to seal the light emitting element and the wire, embedding the hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

FIRST EMBODIMENT

A first embodiment of the present invention will be explained hereinafter with reference to FIGS. 1–5.

Figure 1:
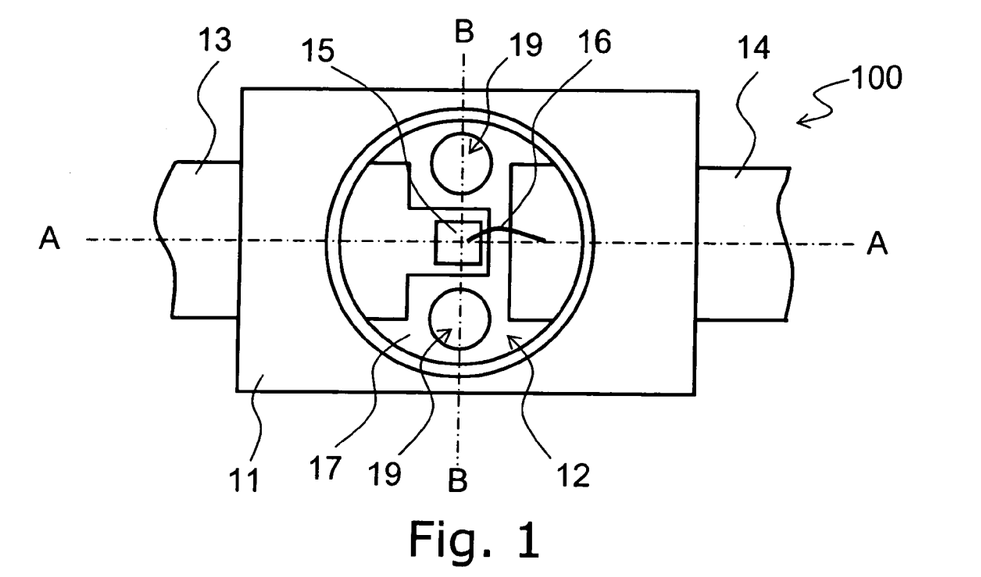
FIG. 1 is a top view of a semiconductor light emitting device in accordance with a first embodiment of the present invention.
Figure 2:
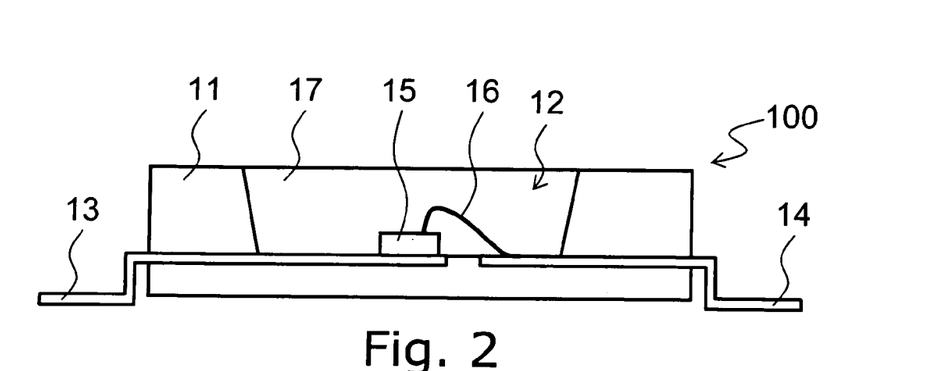
FIG. 2 is a cross sectional view taken along line A—A in FIG. 1.
Figure 3:
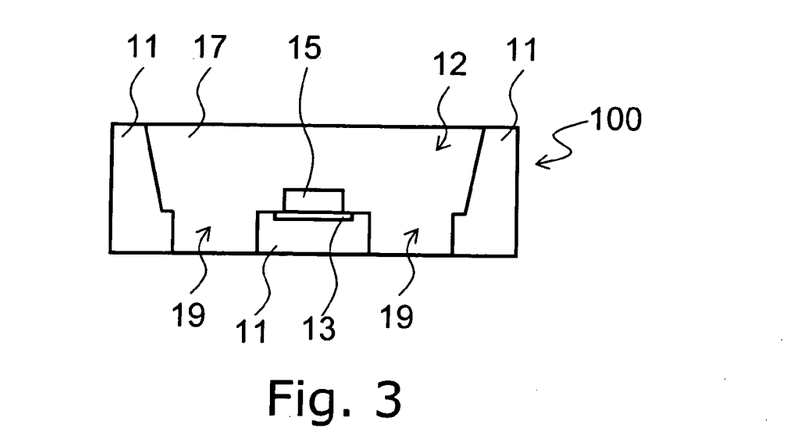
FIG. 3 is a cross sectional view taken along line B—B in FIG. 1.

FIG. 1 a top view of a semiconductor light emitting device 100 in accordance with a first embodiment of the present invention. FIG. 2 is a cross sectional view taken along line A—A in FIG. 1. FIG. 3 is a cross sectional view taken along line B—B in FIG. 1.

In the semiconductor light emitting device 100, a semiconductor light emitting element 15 (LED) is mounted on a first lead 13. A first electrode (not shown in FIG. 1) provided on a top surface of the LED chip 15, is connected to a second lead 14 via a bonding wire 16. The first lead 13 and the second lead 14 are molded by a mold resin 11. The mold resin 11 may be formed by, for example an injection mold. The mold resin 11 may be a thermoplastic resin. A cup shape portion 12 is provided on an upper surface of the mold resin 11 such that an upper surface of the first lead 13 and the second lead 14 are exposed from the mold resin 11. As shown in FIG. 3, the bottom surface of the cup shape portion 12 is on the substantially same plane as the upper surface of the first lead frame 13. The LED chip 15, the first lead 13 and the second lead 14 and the wire 16 are sealed by a sealing resin 17. The sealing resin 17 may be an epoxy resin or a silicone resin. The sealing resin 17 may be preferably transparent to light emitted from the LED chip 15.

A hole 19 is provided in the mold resin 11. As shown in FIG. 3, the hole 19 is penetrating to a bottom surface of the mold resin 11, which is on the same plane as a bottom surface of the semiconductor light emitting device 100. The sealing resin 17 is embedded in the hole 19. For example, the sealing resin 17 is introduced into the hole 19 when the LED chip 15 and the wire 16 are sealed by the sealing resin 17.

In FIG. 1, the hole 19 is penetrated from a bottom surface of the cup shape portion 12 to the bottom surface of the mold resin 11. However, the hole 19 may be provided on the slanted portion of the cup shape portion 12. Furthermore, the hole 19 may be angled from the vertical direction.

The sealing resin 17 is exposed form the hole 19 to outside of the semiconductor light emitting device 100. The hole 19 may be formed by a injection mold of the mold resin 11.

As shown in FIG. 1, two holes 19 is provided upper and below the LED chip 15. A portion of the first lead 13, on which the LED chip 15 is mounted, is narrower than the other part of the first lead 13.

A damage such as peeling or cracking to the LED chip 15 is reduced by a hole 19 filled with the sealing resin 19 even in case an expansion and compression cycle occurs in the sealing resin 17.

The mold resin 11 provided under the LED chip 15 may be adapted a good thermal resistance material. Generally the mold resin 11 is a higher thermal resistance than the sealing resin 17. So the stable operation may be obtained in a high ambient temperature. Namely a heat generated by the LED chip 15 is released downward via the first lead 13 and the mold resin 11 to outside of the semiconductor light emitting device 100. This structure is capable of operating in a higher temperature than a structure having the sealing resin provided under the LED chip 15. So the maximum operating temperature may be increased.

The LED chip 15 is explained.

The LED chip 15 may be used an InGaAlP base semiconductor light emitting element, which emits visible light or an GaN base semiconductor light emitting element, which emits blue light or ultraviolet light. A florescent material such as a phosphor may be dispersed in the sealing resin 17 and a secondary light such as white light may be extracted from the semiconductor light emitting device 100.

The function of the hole 19 is explained.

Figure 4:
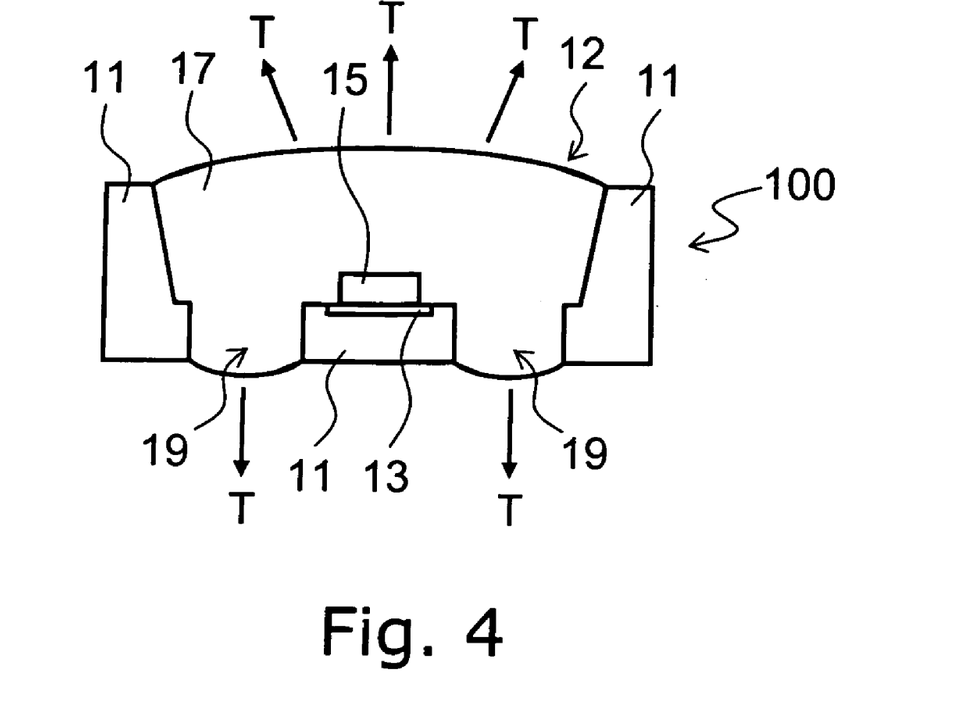
FIG. 4 is a cross sectional view taken along line B—B in FIG. 1, showing a heat expansion of a sealing resin in a high temperature.
Figure 5:
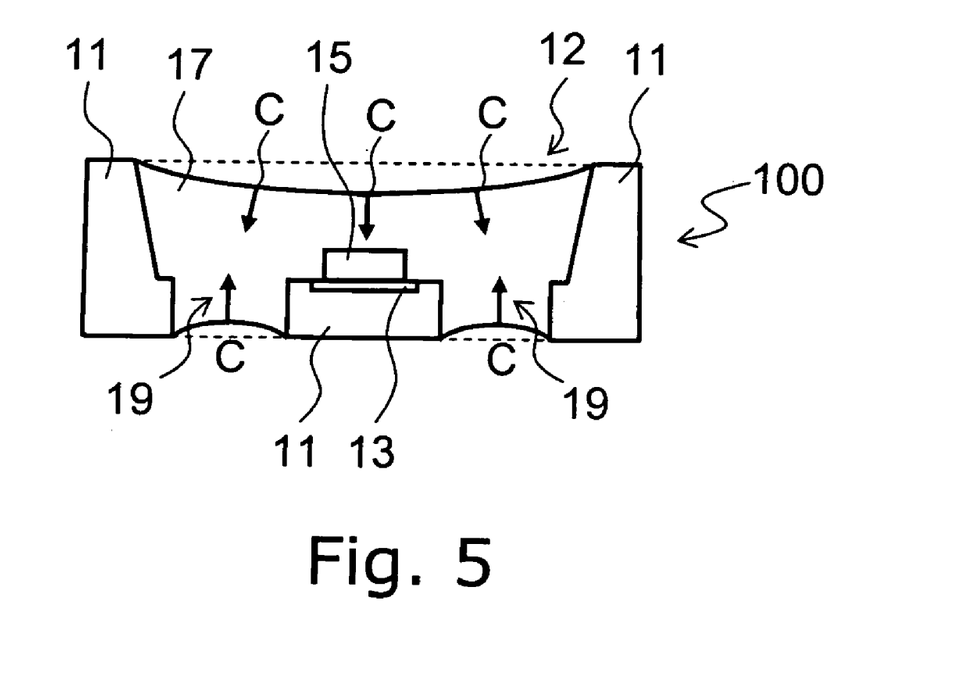
FIG. 5 is a cross sectional view taken along line B—B in FIG. 1, showing a heat compression of a sealing resin in a low temperature.

FIGS. 4–5 are cross sectional views taken along line B—B in FIG. 1, showing a heat expansion and a compression of a sealing resin in a high and low ambient temperature.

Generally a Cu board is used as lead frame is about $16.7 \times 10^{-6}/\square$ in heat expansion index and an iron board is used as lead frame is about $11.8 \times 10^{-6}/\square$ in heat expansion index. On the other hand, the sealing resin 17 (incase epoxy resin) is about $6.3 \times 10^{-5}/\square$ in heat expansion index, which is higher heat expansion index than a material used as a lead frame. So as shown in FIG. 4, in a high temperature, the LED chip 15, the first lead 13, the second lead 14, the wire 16 and the mold resin 11 are pulled by the sealing resin 17. However in this first embodiment, the hole 19 is provided. A tensile stress T is released upward form the cup shape portion 12 and downward from the hole 19. Thus the tensile stress T to the LED chip 15, the wire 16, the first lead 13 and the second lead 14 is reduced.

In a low ambient temperature, the LED chip 15, the wire 16, the first lead 13 and the second lead 14 are compressed by the mold resin 11. As shown in FIG. 5, in this embodiment, a compression stress C is released upward form the cup shape portion 12 and downward from the hole 19. Thus the compression stress C to the LED chip 15, the wire 16, the first lead 13 and the second lead 14 is reduced.

As described above, in this first embodiment, damage to the LED chip 15 or the wire 16 is reduced, since the tensile stress T and the compression stress C are reduced. So peeling or cracking of the LED chip 15 may be prevented. The wire 16 is hardly to be cut.

COMPARATIVE EXAMPLE

Figure 6:
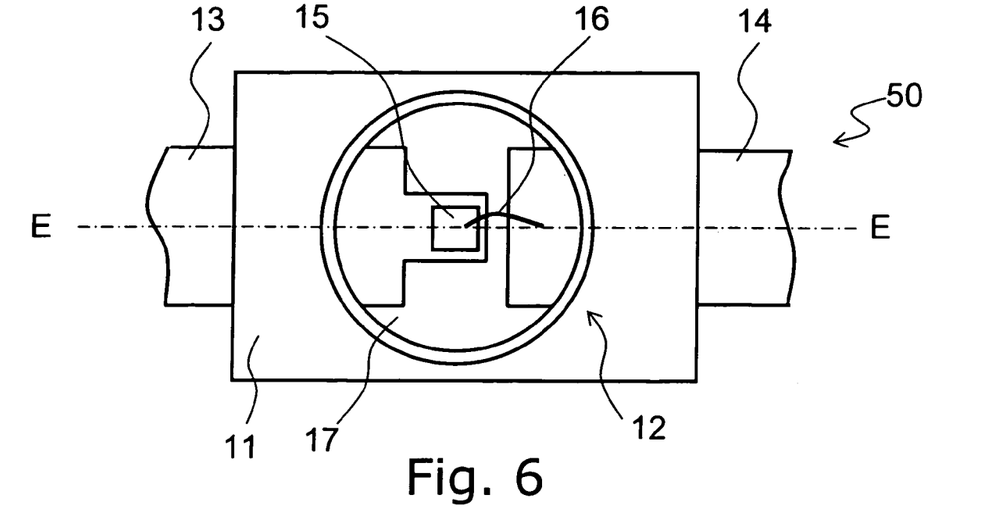
FIG. 6 is a top view of a semiconductor light emitting device in accordance with a comparative example.
Figure 7:
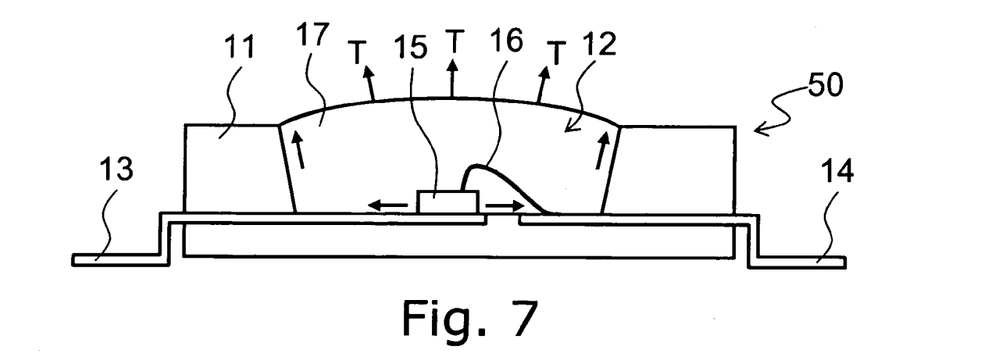
FIG. 7 is a cross sectional view taken along line E—E in FIG. 6, showing a heat expansion of a sealing resin in a high temperature.

A comparative example is explained with reference to FIGS. 6–8, wherein FIG. 6 is a top view of a semiconductor light emitting device in accordance with a comparative example; FIG. 7 is a cross sectional view taken along line E—E in FIG. 6, showing a heat expansion of a sealing resin in a high temperature, and FIG. 8 is a cross sectional view taken along line E—E in FIG. 6, showing a heat compression of a sealing resin in a low temperature.

In this comparative example, the hole 19 is not provided in the mold resin 11. As shown in FIG. 7, the sealing resin 17 is expanded at high ambient temperature, so that the expanded sealing resin 17 in the cup shape portion 12 of the mold resin 11 is protruded upward of the cup shape portion 12, and in a bottom of the cup shape portion 12, a tensile stress T to LED chip 15 and a boundary between the wire 16 and the second lead 14, which has low heat expansion index, is generated.

Figure 8:
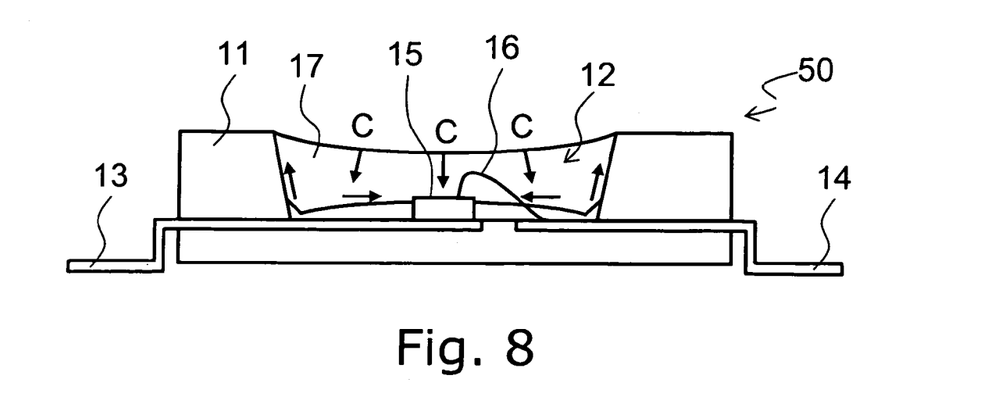
FIG. 8 is a cross sectional view taken along line E—E in FIG. 6, showing a heat compression of a sealing resin in a low temperature.

As shown in FIG. 8, the sealing resin 17 is compressed and the compression stress C is generated so that the sealing resin 17 is peeled form the first lead 13 or the second lead 14 in the bottom of the sup shape portion 12.

After the heat expansion and compression cycle, the sealing resin 17 may be peeled from the bottom of the cup shape portion 12. A stress strain to the LED chip 15 may be accumulated. A cracking in the LED chip 15 and a weakening in an adhesive boundary between the lead and the wire may occur, especially at the bonding portion on the LED chip 15.

However, in the first embodiment, the hole 19, penetrating from the cup shape portion 12 to the bottom surface of the mold resin 11, is provided in the mold resin 11. So stress may be released to bottom side of the mold resin 11, and peeling of the sealing resin 17, cutting of the wire 16 or damage to the LED chip 15 may be reduced, in case a wide range heat cycle is applied to the semiconductor light emitting device 100.

SECOND EMBODIMENT

Figure 9:
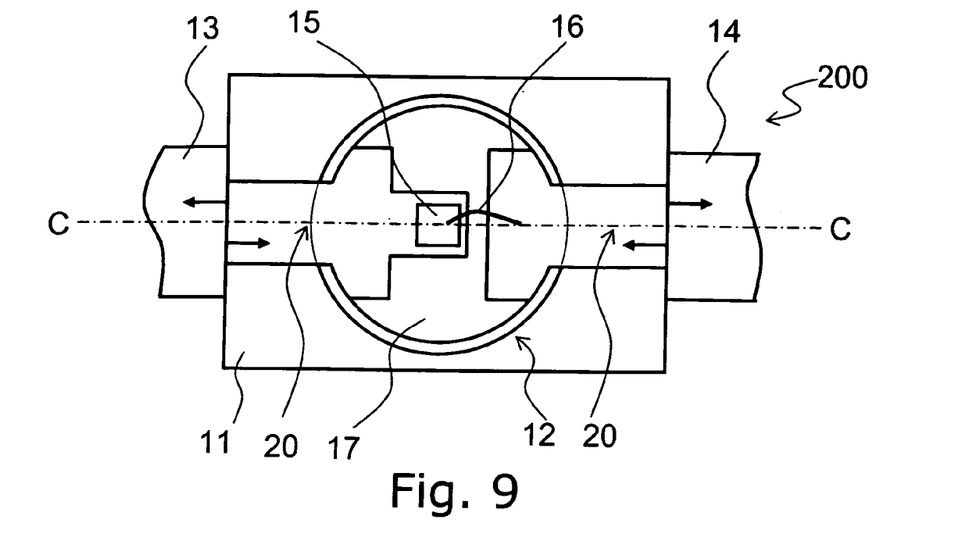
FIG. 9 is a top view of a semiconductor light emitting device in accordance with a second embodiment of the present invention.
Figure 10:
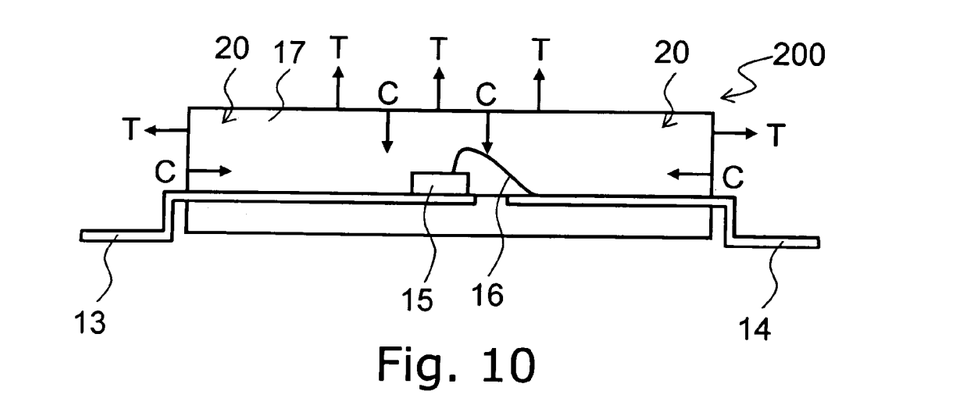
FIG. 10 is a cross sectional view taken along line C—C in FIG. 9.
Figure 11:
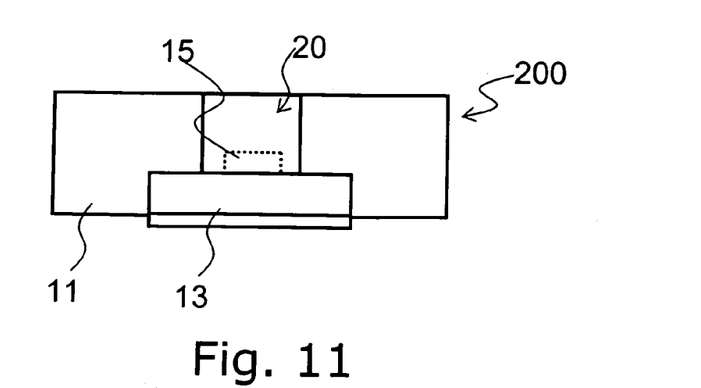
FIG. 11 is an end view of the semiconductor light emitting device shown in FIG. 9.

A second embodiment is explained with reference to FIGS. 9–11, wherein FIG. 9 is a top view of a semiconductor light emitting device in accordance with the second embodiment of the present invention, and FIG. 10 is a cross sectional view taken along line C—C in FIG. 9, and FIG. 11 is an end view of the semiconductor light emitting device shown in FIG. 9.

In this second embodiment, trenches 20 are provided in the mold resin 11. The trench 20 extends from the cup shape portion to outside of the mold resin along the first lead 13 and the second lead 14, respectively. The trenches 20 are provided on the first lead 13 and the second lead 14, and in contact with the first lead 13 and the second lead 14, respectively. The sealing resin 17 is embedded in the trenches 20.

Similar to the effect provided by the hole 19 in the first embodiment, the tensile stress T or the compression stress C generated in the cup shape portion 12 is released by the trench 20. A stress along a horizontal direction, which is generated between the LED chip 15 mounted surface and the sealing resin 17, is reduced by the trench 20. Thus peeling of the sealing resin 17, cutting of the wire 16 or damage to the LED chip 15 may be reduced in case a wide range heat cycle is applied to the semiconductor light emitting device 200.

THIRD EMBODIMENT

Figure 12:
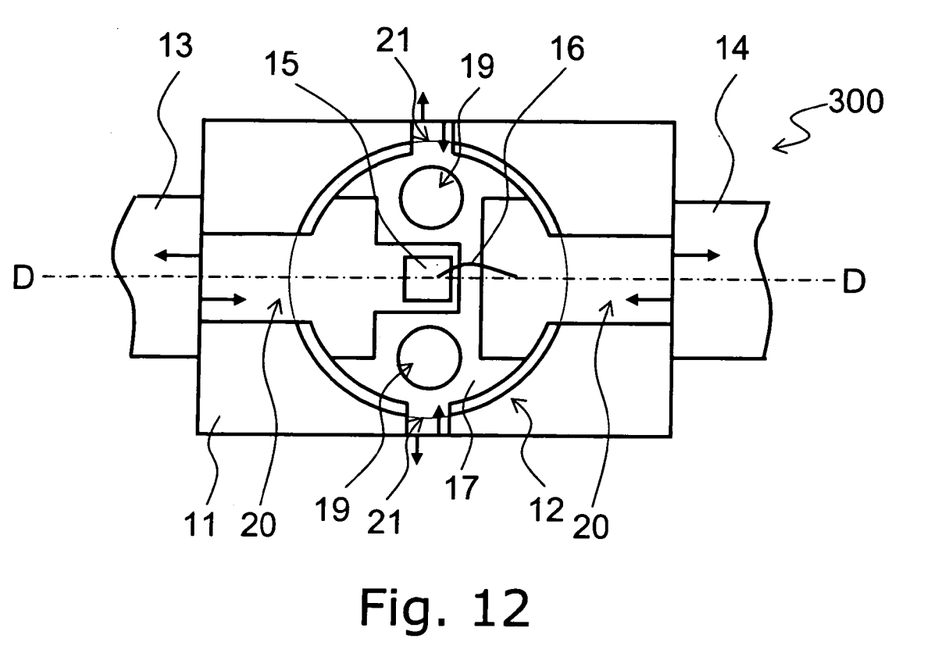
FIG. 12 is a top view of a semiconductor light emitting device in accordance with a third embodiment of the present invention.
Figure 13:
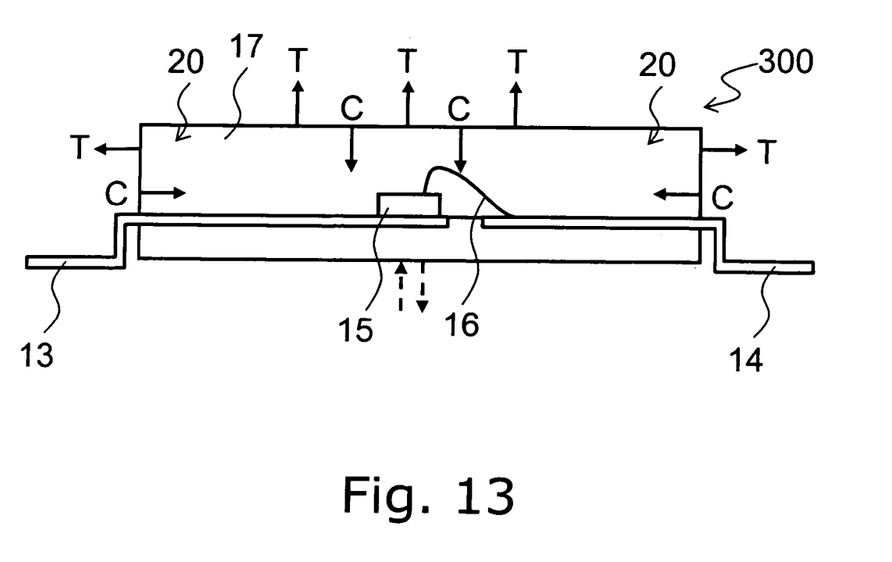
FIG. 13 is a cross sectional view taken along line D—D in FIG. 12.

A third embodiment is explained with reference to FIGS. 12–13. In this third embodiment, a trench 21 is provided in the mold resin 11 in a direction, which is perpendicular to the lead extending direction. Two trenches 21 extend in a direction perpendicular to the trench 20 extending direction. The tensile stress T or the compression stress C generated in the cup shape portion 12 is released by the trenches 20 and 21.

Furthermore, the holes 19 are also provided in the mold resin 11. So the tensile stress T or the compression stress C generated in the cup shape portion 12 is released by the holes 19 and trenches 20 and 21.

The stress generated in the cup shape portion is released in the horizontal direction by the hole 19. The stress generated in the cup shape portion is released in the vertical direction by the trench 20 and 21. Thus the peeling of the sealing resin 17, cutting of the wire 16 or damage to the LED chip 15 may be reduced in case a wide range heat cycle is added to the semiconductor light emitting device 300.

In the third and the fourth embodiment, the trenches 20 and 21 extend parallel to or perpendicular to the direction in which leads 13 and 14 extend. However, the trenches may extend in another direction.

FOURTH EMBODIMENT

Figure 14:
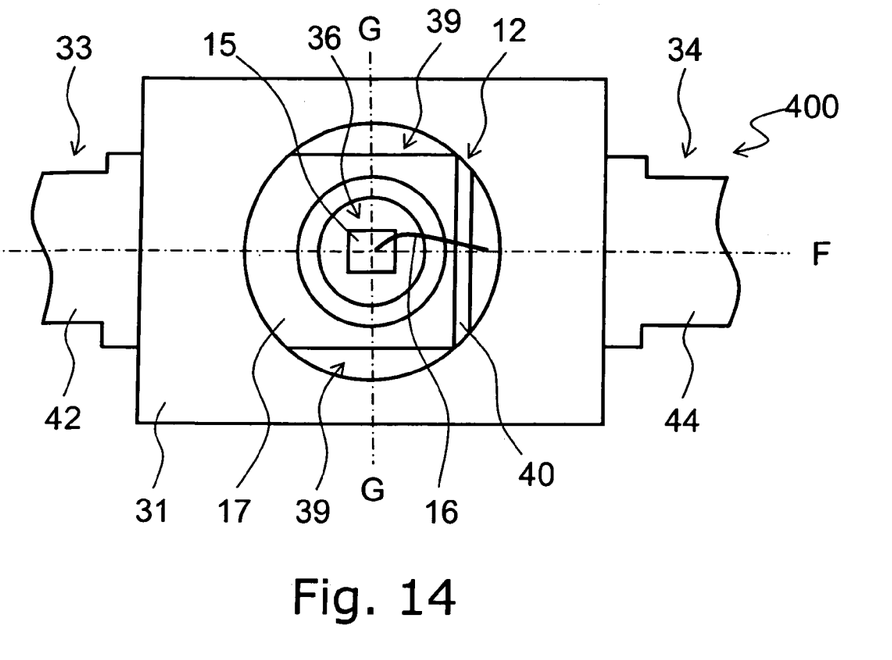
FIG. 14 is a top view of a semiconductor light emitting device in accordance with a fourth embodiment of the present invention.
Figure 15:
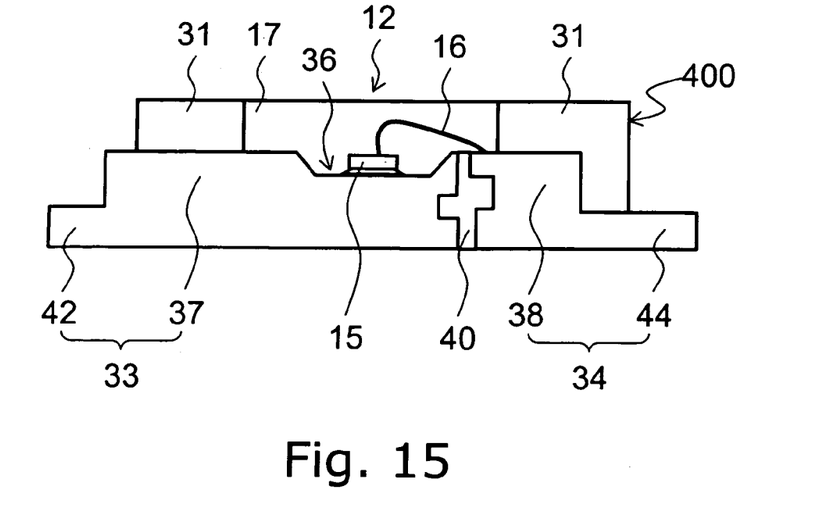
FIG. 15 is a cross sectional view taken along line F—F in FIG. 12.
Figure 16:
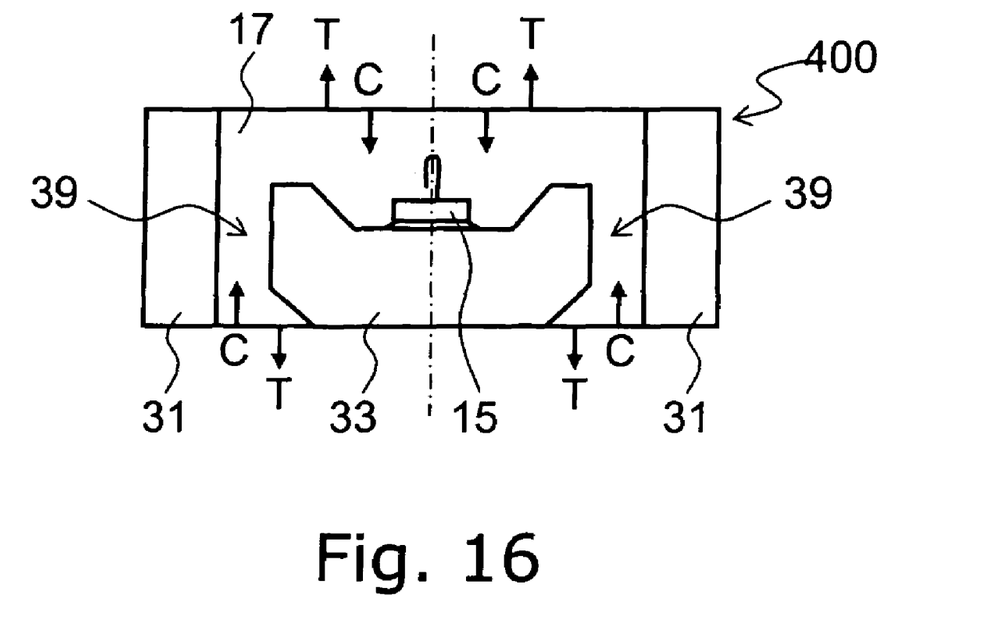
FIG. 16 is a cross sectional view taken along line G—G in FIG. 12, showing a heat expansion and compression of a sealing resin in a high and low temperature.
Figure 17:
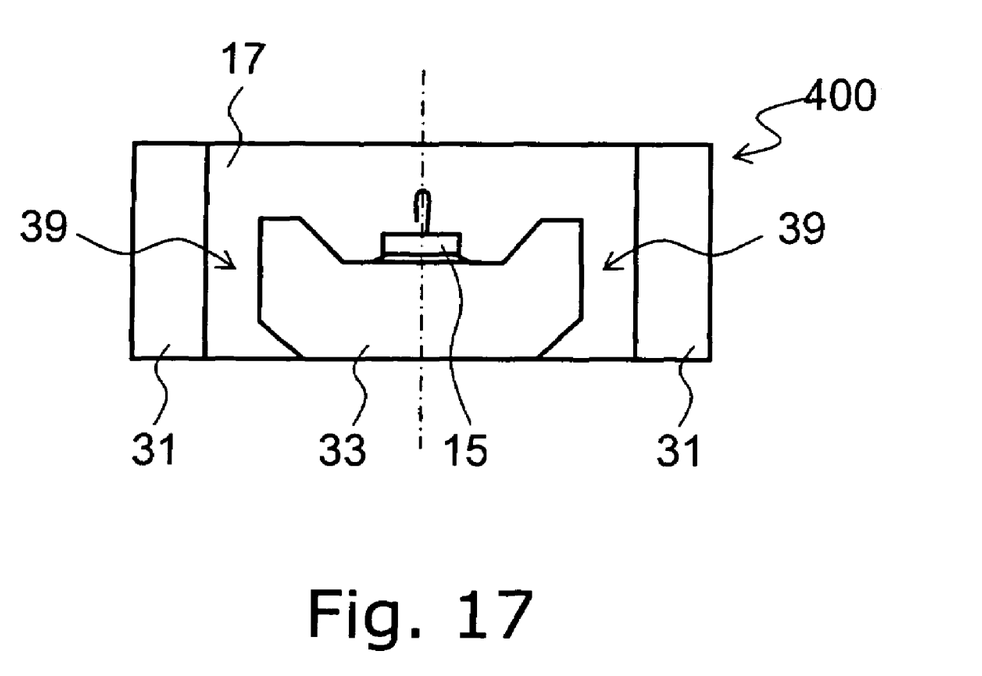
FIG. 17 is a cross sectional view taken along line G—G in FIG. 12, showing a semiconductor light emitting device before applying a sealing resin.

A fourth embodiment will be explained with reference to FIGS. 14–17, in which FIG. 14 is a top view of a semiconductor light emitting device in accordance with a fourth embodiment of the present invention; FIG. 15 is a cross sectional view taken along line F—F in FIG. 12; FIG. 16 is a cross sectional view taken along line G—G in FIG. 12, showing a heat expansion and compression of a sealing resin in a high and low temperature; and FIG. 17 is a cross sectional view taken along line G—G in FIG. 12, showing a semiconductor light emitting device before applying a sealing resin.

This fourth embodiment is suitable to a high luminosity (high optical output) type semiconductor light emitting device 400.

A first lead 33 and a second lead 34 are made of a high heat conductivity metal. The first lead 33 has an outer lead portion 42 and an inner lead portion 37 which is thicker than the outer lead portion 42. A cavity 36, on which the LED chip 15 is mounted, is provided on the inner lead portion of the first lead 33. The LED chip 15 may be mounted on a bottom of the cavity 36 via eutectic solder such as AuSn. A bottom surface of the first lead 33 and the second lead 34 are exposed to the outside. A heat sink (not shown in FIGS. 14–17) may be provided on the bottom surface of the first lead 33 and the second lead 34 so that heat generated in the LED chip 15 may easily be released to the outside. Light extracted from the semiconductor light emitting device 400 may be increased by the cavity 36, since light emitted from the LED chip 15 is reflected from an inner surface of the cavity 36.

The mold resin 31 is injection molded. The first lead 33 and the second lead 34 extend in opposite directions. The cup shape portion 12 is provided in the mold resin 31. As shown in FIG. 14, a hole 39, which is not a round shape in the top view, is provided in both sides (upper and below) of the first lead 33. Sealing resin 17 is embedded in the holes 19.

The diameter at the bottom surface of the cup shape portion 12 along line G—G is greater than the width of the first lead 13 in the cup shape portion 12. So the hole 39, which has a semicircle shape in the top view, is provided.

A gap 40 between the first lead 33 and the second lead 34 is embedded by the mold resin 31. However, the gap 40 may be embedded by the sealing resin 17 or another resin.

The tensile stress T at high temperature and the compression stress C at low temperature are released via the cup shape portion 12, which opens upward and the hole 39, which opens downward. Thus the peeling of the sealing resin 17, cutting of the wire 16 or damage to the LED chip 15 may be reduced, in case a wide range heat cycle is applied to the semiconductor light emitting device 400.

In this embodiment, a region under the LED chip 15 is the inner lead portion 37 and the sealing resin 17 is not provided under the LED chip 15. So the semiconductor light emitting device 400 has good heat release efficiency by virtue of the inner lead 37 of the first lead 33 being exposed to a bottom surface of the semiconductor light emitting device 400. Heat generated in the LED chip 15 is easily released to the outside via the inner lead 37. So, for example, driving the semiconductor light emitting device at a higher output may be possible compared to a structure having a sealing resin 17 provided under the LED chip 15. So the operating temperature may be improved.

The trenches 20 and 21, which extend in a direction parallel to or perpendicular to the lead extending direction, may be provided in the mold resin 31 in a manner similar to the second embodiment or the third embodiment. In such a case, the stress generated in the cup shape portion 12 is reduced.

As described in the first to the fourth embodiments, stress release by means of a hole and/or a trench, is provided in a mold resin. Thus the peeling of the sealing resin 17, cutting of the wire 16 or the damage to the LED chip 15 may be reduced, in case a wide range heat cycle is applied to the semiconductor light emitting device.

Furthermore, the shape of the hole in the mold resin is not limited to a circle. The shape of the hole in the mold resin may be oval, semicircle, square, rectangular, polygonal shape or the like, as long as the hole penetrated through the mold resin, as shown, e.g., in FIGS. 16–17.

Likewise, the shape of the cup shape portion in the mold resin is not limited to a circle, but may also be oval, semicircle, square, rectangular, polygonal shape or the like.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor light emitting device, comprising:
    a mold resin having a cup shape portion on an upper surface of the mold resin and having a first trench extending from the cup shape portion to outside of the mold resin in a first direction and a second trench extending from the cup shape portion to outside of the mold resin in a second direction which is opposite to the first direction;
    a first lead provided in the mold resin and extending from the cup shape portion to outside of the mold resin in a third direction;
    a second lead provided in the mold resin and extending from the cup shape portion to outside of the mold resin in a fourth direction which is opposite to the third direction;
    a light emitting element mounted on the first lead in the cup shape portion;
    a wire electrically connecting the light emitting element and the second lead; and
    a sealing resin embedded in the first and second trenches and configured to seal the light emitting element and the wire.

2. A semiconductor light emitting device of claim 1, wherein the first direction is perpendicular to the third direction.

3. A semiconductor light emitting device of claim 1, wherein the first direction is parallel to the third direction.

4. A semiconductor light emitting device of claim 1, wherein the mold resin has a third trench extending from the cup shape portion to outside of the mold resin in a fifth direction which is perpendicular to the first direction and a fourth trench extending from the cup shape portion to outside of the mold resin in a sixth direction which is opposite to the fifth direction and perpendicular to the first direction,
    wherein the sealing resin is embedded in the third trench and the fourth trench.

5. A semiconductor light emitting device of claim 4, wherein the first direction is perpendicular to the third direction.

6. A semiconductor light emitting device of claim 4, wherein the first direction is parallel to the third direction.

7. A semiconductor light emitting device of claim 1, wherein the first trench is in contact with the first lead and the second trench is in contact with the second lead.

* * * * *